(12) United States Patent
Head et al.

(10) Patent No.: US 11,867,011 B2
(45) Date of Patent: Jan. 9, 2024

(54) BOREHOLE SAND CATCHER

(71) Applicant: FALLBACK LLC, Tulsa, OK (US)

(72) Inventors: Philip Head, Sunningdale (GB);
Lawrence Hugh Burleigh, Tulsa, OK (US)

(73) Assignee: Fallback LLC, Tulsa, OK (US)

( * ) Notice: Subject to any disclaimer, the term of this patent is extended or adjusted under 35 U.S.C. 154(b) by 0 days.

(21) Appl. No.: 17/051,894

(22) PCT Filed: Apr. 30, 2019

(86) PCT No.: PCT/GB2019/051200
§ 371 (c)(1),
(2) Date: Oct. 30, 2020

(87) PCT Pub. No.: WO2019/211600
PCT Pub. Date: Nov. 7, 2019

(65) Prior Publication Data
US 2021/0164310 A1 Jun. 3, 2021

(51) Int. Cl.
*E21B 27/00* (2006.01)
*E21B 43/12* (2006.01)
*F04B 47/00* (2006.01)
*B23K 26/03* (2006.01)
*B23K 26/38* (2014.01)
*H03K 5/24* (2006.01)

(52) U.S. Cl.
CPC .......... *E21B 27/005* (2013.01); *E21B 43/121* (2013.01); *F04B 47/005* (2013.01); *B23K 26/032* (2013.01); *B23K 26/38* (2013.01); *E21B 2200/05* (2020.05); *H03K 5/24* (2013.01)

(58) Field of Classification Search
CPC ....... F04B 47/005; B23K 26/38; B23K 26/03; B23K 26/032; B23K 31/125; E21B 27/00; E21B 11/04; E21B 31/08; E21B 34/06; E21B 41/0021; E21B 43/08; E21B 43/121; E21B 43/13; E21B 43/38; E21B 43/35; E21B 2200/05; H01S 3/00; H03K 5/24
See application file for complete search history.

(56) References Cited

U.S. PATENT DOCUMENTS

| 642,483 | A | * | 1/1900 | Pew | F04B 47/005 166/105.2 |
|---|---|---|---|---|---|
| 2,124,840 | A | * | 7/1938 | Wrigley | E21B 33/04 166/84.1 |
| 2,267,459 | A | * | 12/1941 | Hait | F04C 13/008 418/46 |
| 3,090,324 | A | * | 5/1963 | Schmidt | F04B 47/005 166/105.2 |

(Continued)

*Primary Examiner* — George S Gray
(74) *Attorney, Agent, or Firm* — Weiss & Moy, PC; Jeffrey D. Moy

(57) ABSTRACT

A downhole apparatus for collecting solids fallback in the tubing of an oil producing borehole comprises two or more baskets to collect the solids fall back, each basket partially occupying a portion of the inner cross section of the tubing, leaving a portion of the inner cross section of the tubing having an unrestricted flow path. The baskets when considered in plan view along longitudinal axis of the tubing are distributed such that together they cover substantially the whole area of the tubing while leaving an unobstructed non-straight flowpath around the baskets.

16 Claims, 14 Drawing Sheets

(56) References Cited

U.S. PATENT DOCUMENTS

2016/0326850 A1* 11/2016 Hailey, Jr. ............... E21B 33/12
2017/0218735 A1    8/2017 Mericas
2018/0073317 A1*  3/2018 Haugland ............... E21B 43/08
2020/0102809 A1*  4/2020 Schindler ................ E21B 10/00

* cited by examiner

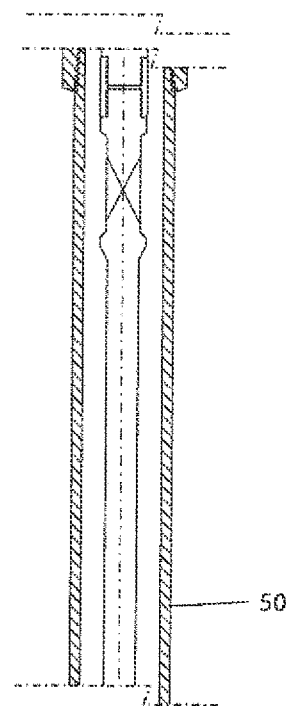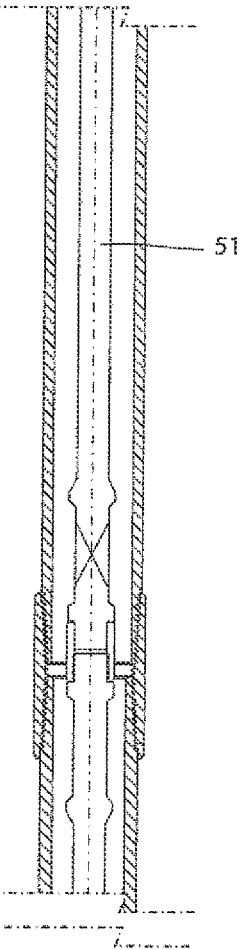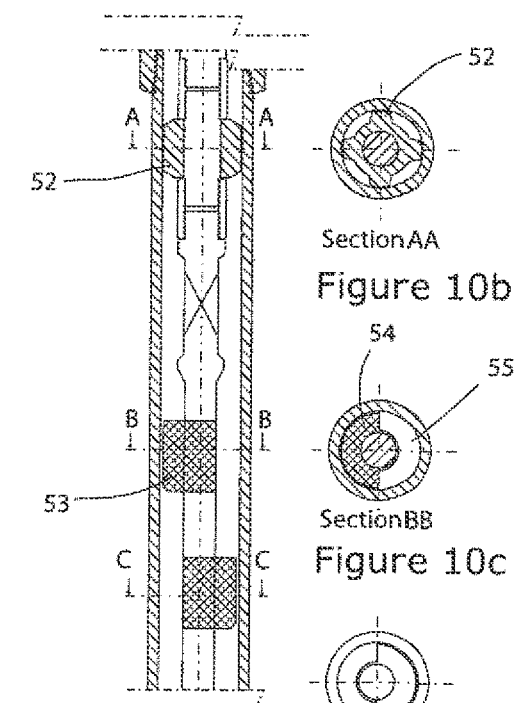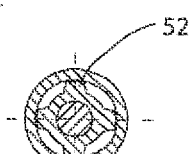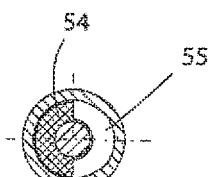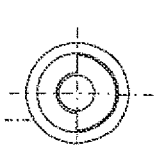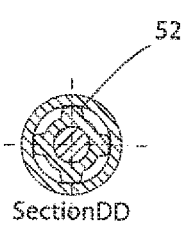
Figure 9  Figure 10a

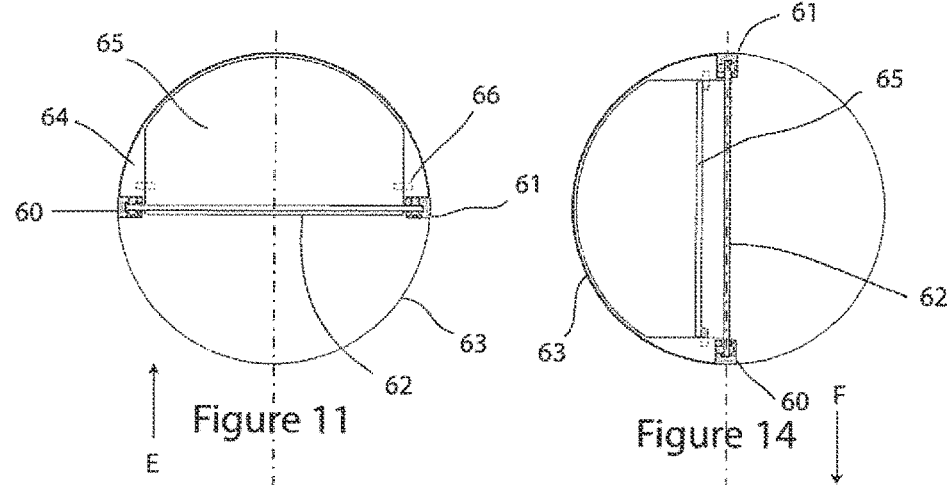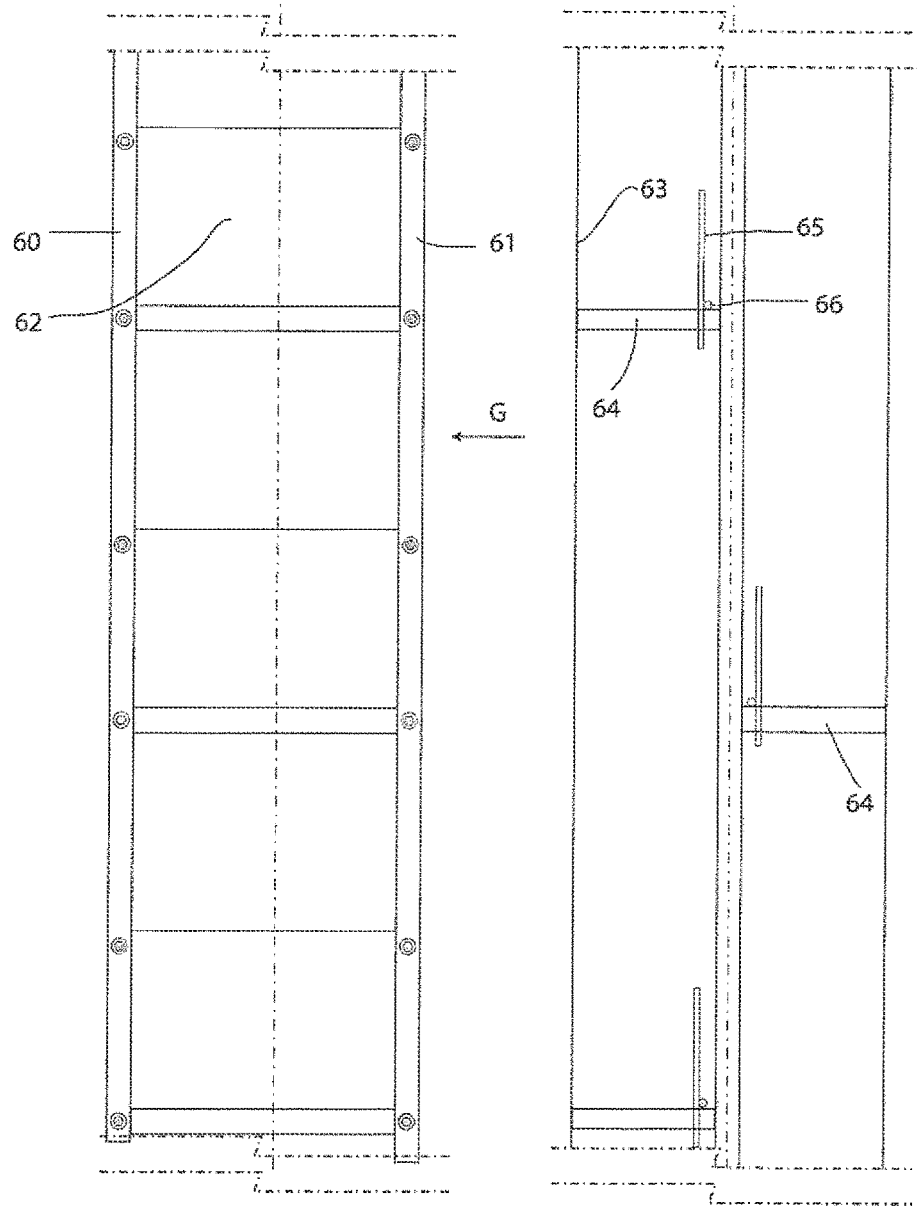
Figure 11  Figure 14
Figure 12  Figure 13

| Basket type for ESP | | | | Basket type for rod lift | | |
|---|---|---|---|---|---|---|
| Tubing | 4.5 | 3.5 | 2.875 | 2.375 inch | Tubing | 2.875 | 2.375 inch |
| Tubing ID | 3.958 | 2.797 | 2.259 | 1.867 inch | Tubing ID | 2.259 | 1.867 inch |
| OD of basket | 3.9 | 2.7 | 2.125 | 1.75 inch | OD of basket | 2.125 | 1.75 inch |
| ID of basket | 0.75 | 0.75 | 0.5 | 0.5 inch | rod OD | 1.125 | 1 inch |
| angle of basket | 210 | 210 | 210 | 210 degrees | angle of basket | 210 | 210 degrees |
| length of basket | 12 | 12 | 12 | 12 inch | length of basket | 12 | 12 inch |
| length between basket | 6 | 6 | 6 | 6 inch | length between basket | 6 | 6 inch |
| length of tubing | 30 | 30 | 30 | 30 ft | Length of sucker rod | 30 | 30 ft |
| no of basket per joint | 20 | 20 | 20 | 20 | No. of baskets per rod | 20 | 20 |
| Volume /basket | 80.53 | 36.99 | 23.45 | 15.46 inch^3 | Volume /basket | 17.87 | 11.34 inch^3 |
| Density of sand | 0.052 | 0.052 | 0.052 | 0.052 lbs/inch^3 | Density of sand | 0.052 | 0.052 lbs/inch^3 |
| mass of sand per basket | 4.20 | 1.93 | 1.22 | 0.81 lbs | mass of sand per basket | 0.93 | 0.59 lbs |
| total mass per joint | 83.90 | 38.54 | 24.43 | 16.11 lbs | Total mass per rod | 18.62 | 11.81 lbs |
| safety factor | 3.64 | 3.34 | 3.25 | 3.14 | safety factor | 3.29 | 3.23 |
| Well depth | 3000 | 3000 | 3000 | 3000 ft | Well depth | 3000 | 3000 ft |
| Sand Concentration | 0.10% | 0.10% | 0.10% | 0.10% | Sand Concentration | 0.10% | 0.10% |
| Sand volume | 3 | 3 | 3 | 3 ft | Sand volume | 3 | 3 ft |
| Tubing OD | 4.5 | 3.5 | 2.875 | 2.375 inch | Tubing OD | 2.875 | 2.375 inch |
| Tubing ID | 3.958 | 2.797 | 2.259 | 1.867 inch | Tubing ID | 2.259 | 1.867 inch |
| | | | | | rod OD | 1.125 | 1 inch |
| Volume of sand | 442.94 | 221.20 | 144.29 | 98.56 inch^3 | Volume of sand | 108.50 | 70.28 inch^3 |
| Mass of sand | 23.08 | 11.52 | 7.52 | 5.13 lbs | Mass of sand | 5.65 | 3.66 lbs |

Figure 15

Figure 17 Detail A

Figure 18 section DD

Figure 19 Section EE

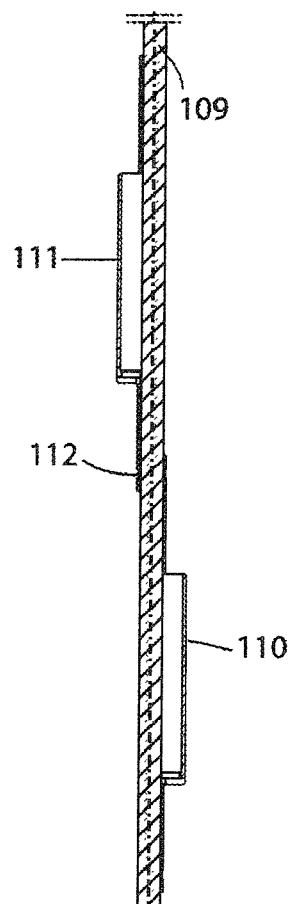
Figure 27
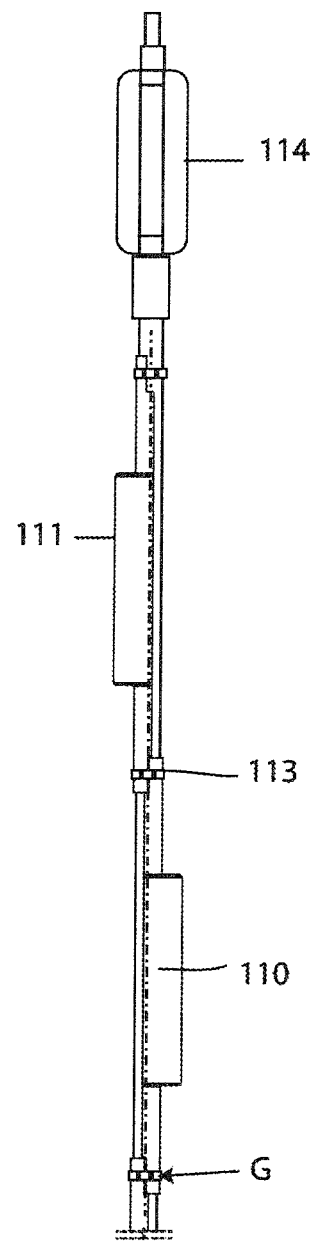
Figure 28
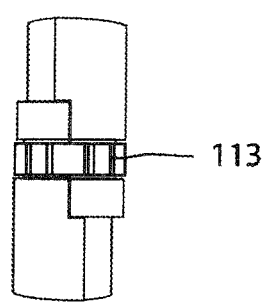
Figure 29 (Detail G)

BOREHOLE SAND CATCHER

BACKGROUND TO THE INVENTION

Specialised downhole pumps are used in the hydrocarbon exploration and production industry in various applications, and in particular for the production of hydrocarbons to surface from significant wellbore depths. There are several types of downhole pump in use, including Electrical Submersible Pumps (ESPs) and Progressive Cavity Pumps (PCPs). An ESP is typically located at the bottom of the production tubing, and comprises a downhole electric motor powered and controlled from surface by a power cable which connects to the wellhead. ESPs are highly efficient pumps capable of high production rates, and are particularly well-suited to the production of lighter crude oils, and are less capable with heavy crudes.

A PCP, like an ESP, is typically attached to the bottom end of a production tubing. A PCP comprises a rubber stator having a helical internal profile which mates with a rotor having an external screw profile. The rotor is connected to a rotating shaft, which extends through the production tubing and is driven by a surface motor. PCPs are normally specified for their ability to produce heavy crudes.

Downhole pumps are sensitive to sands and other abrasive solids being present in the production fluid. The amount of sand which is produced from a well depends on characteristics of the formation, and various methods are used to control sand production. However, it is common for some amount of sand or abrasive solids to be present in the production fluid. ESPs are particularly sensitive to sand presence due to the nature of their internal components.

With many production systems which use a downhole pump, problems can arise when the pump is shut down after a period of pumping fluid up the production tubing to surface. On pump shutdown, flow ceases very quickly as the fluid levels in the production bore and the annuluses equalise.

Gravity acting on the sand particles present in the column of fluid above the pump (which could be several thousand metres) causes the sand and any other solids to fall back towards the pump. Due to the complex configuration of the interior features of the pump, there is no direct path for the sand to pass through the pump. and therefore it tends to settle on top of the pump. This can cause the pump to become plugged.

When production operations are resumed, a higher load is required to start the pump and push the plug of sand up from the pump. In some cases this can cause motor burn out in an ESP or breaking of the rotor shaft of PCP. Such failure of the downhole pump requires work-over involving pull-out and reinstallation of the completion. This is an expensive and time-consuming operation.

It is amongst the aims and objects of the invention to provide a downhole apparatus and method which addresses the above-described deficiencies of downhole pump systems.

Further aims and objects will become apparent from reading the following description.

SUMMARY OF THE INVENTION

According to a first aspect of the invention there is provided a downhole apparatus according to claim 1.

It consists of at least one section of the flow path having an unobstructed flow and the remaining flow path having a container to collect the solids fall back being partially make of a filter material The baskets are distributed so that when considered in plan (i.e. along the longitudinal axis of the borehole) the baskets together cover the entire area of the borehole section, while each basket covers only part of the section, leaving an unimpeded section around which borehole fluid may flow. That is, the baskets (in plan) are not all fully coincident, but each basket is offset from at least one other basket. Typically this will be achieved by setting different baskets at different angles so that each basket occupies a sector of the borehole cross-section.

Particularly when there is a plurality of baskets, each basket may be fully coincident with some baskets while non-coincident with other baskets; a simple distribution as illustrated below is where there are two sets of baskets, a first set being distributed so that each basket is coincident and subtends one 180 degree sector of the borehole section, while the second set of baskets subtends the remaining 180 degree sector of the borehole section, the baskets of the first set and the second set distributed along a length of the borehole in an alternating manner.

However, the baskets may be of a size and shape that each basket covers a different sector (or other shape), and the baskets may be dissimilarly shaped, but still providing complete or near complete coverage of the borehole section when considered together, while also providing a serpentine flowpath around the baskets.

According to a further aspect of the invention it comprises a body configured to be coupled to a production tubular and comprising an upper opening and a lower opening;

Inside the tubular body are baskets occupying a portion of the flow area, so fluid can move freely around the basket, in the event of solids fall back, the basket will collect any solids falling directly above it.

If more than one basket, the baskets can be arranged to collect fall back solids from different sectors of the tube, the baskets may overlap each other in terms of coverage.

The base of the basket can be just a filter, or a flapper valve made of filter construction, in the event of a surge of solids the flapper can open to provide virtually full bore flow until the surge has passed.

The downhole apparatus may form a part of a hydrocarbon production system, and may be used during production of hydrocarbons. The apparatus may therefore collect solid particles from a production fluid.

The apparatus may include no moving parts.

The apparatus may include a flapper valve as part of the bottom of the basket.

The arrangement could be part of a rod lift pump system and incorporated into the pump plunger body.

The baskets could also be arranged to fit onto a joint of a rod lift shaft, and arranged to collect any solids fallback The baskets may include a sintered mesh filter The baskets may include a wire screen filter The filter gap may be created by the injection moulding process.

The basket may include ceramic V shaped bars with the gap width, length and diameter tailored to the specific application/well bore The basket may include a combination of V shaped bars and round rods, the rod rods lift off from the V seat to provide a large flow area up and then sit down on the V shape bars in reverse flow and have minimum or no flow back Filters of different mesh size can be incorporated into the tools multi shelf arrangement, large mesh at the top i.e. 40 mesh and the mesh size decreasing down the tool such as 70, 100, 120, and 150 mesh Preferably, the hydrocarbon production system is an artificial lift production system, which may comprise one or more downhole pumps located below the downhole apparatus.

The apparatus may also be through tubing deployable and retrievable, eliminating the need for a rig to workover the well The pumps may be Electrical Submersible Pumps (ESPs), Progressive Cavity Pumps (PCPs) or rod lift (nodding donkey). Therefore the apparatus may prevent passage of the solids downward through the apparatus and towards a downhole pump. The solids are prevented from passing through or settling on the downhole pump by being collected in the apparatus.

Once production is recommenced the apparatus self-cleans itself ready for the next shut down.

If all the baskets are full it is possible to pump down past the apparatus chemical treatments such as scale prevention to the pump below, as there is no check valve or non-return poppet valve as part of the assembly.

It will be appreciated that the downhole apparatus may be connected to production tubing at the lower opening, or may be installed on or in a downhole pump with no intermediate tubing or via a specialised connecting sub-assembly.

The apparatus maybe installed before the pump inlet, and inverted to collect solids before they enter the pump

BRIEF DESCRIPTION OF THE DRAWINGS

There will now be described, by way of example only, embodiments of the invention with respect to the following drawings.

FIG. 9 is a section side view of a well bore production tubing with a rod lift string installed inside it.

FIG. 10*a* is a similar view to FIG. 9 with the rod lift joint centralised at both ends and solid fall-back baskets located on the rod lift shaft.

FIGS. 10*b*, 10*c*, 10*d* and 10*e* show cross sections of the embodiment of FIG. 10*a* through the lines A-A, B-B, C-C, D-D of FIG. 10*a* respectively.

FIG. 11 is a plan view of another embodiment of the invention.

FIG. 12 is a side view E of FIG. 11.

FIG. 13 is a side view G of FIG. 12.

FIG. 14 is a plan view F of FIG. 13.

FIG. 15 is a table showing details of typical configurations, dimensions, solid fall-back storage volumes etc.

FIG. 17 is detail A of FIG. 16.

FIG. 18 is end section view OD of FIG. 17.

FIG. 19 is end section view EE of FIG. 17.

FIG. 27 is a section side view of two of the components shown in FIG. 23, each orientated 180 degrees with each other.

FIG. 28 is a rendered view similar to FIG. 27, with the addition of a centraliser.

FIG. 29 is a blown-up view of detail G.

DETAILED DESCRIPTION OF PREFERRED EMBODIMENTS

Figure 1:
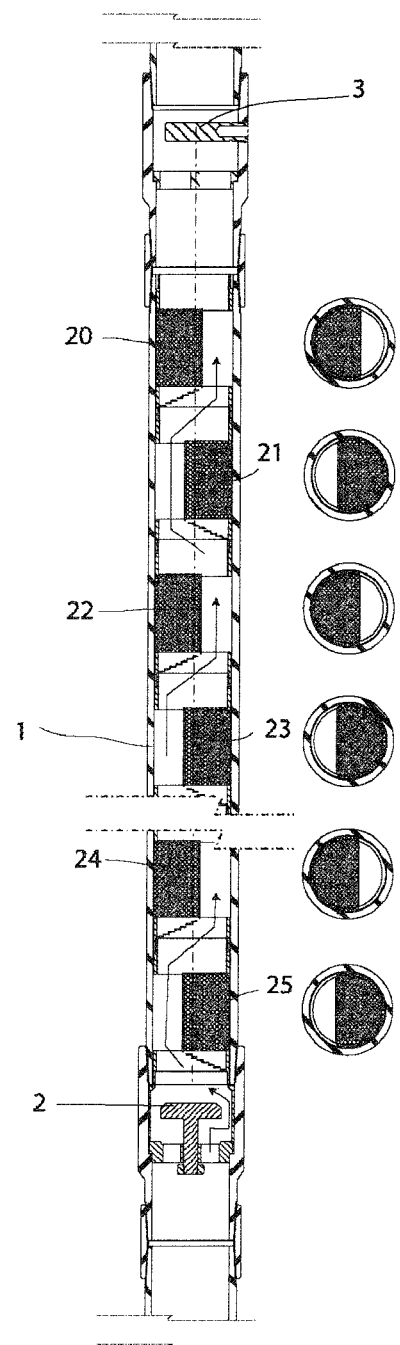
FIG. 1 is a section side view of tubing in a well with one embodiment of the complete apparatus installed inside it.
Figure 2:
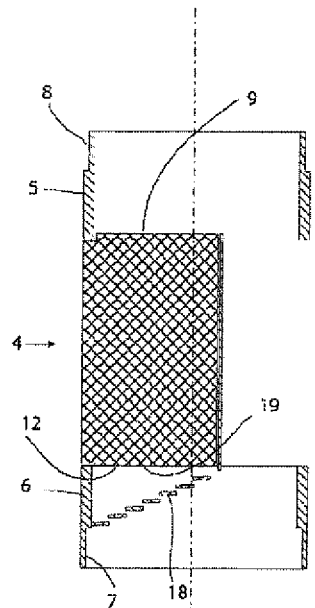
FIG. 2 is a section side view of one embodiment of the invention.
Figure 4:
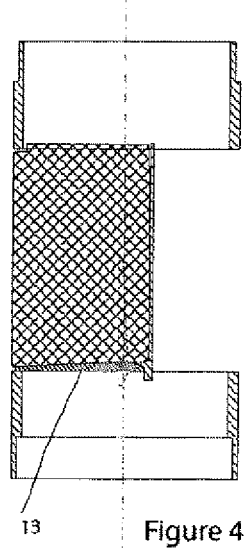
FIG. 4 is a section side view of another embodiment of the invention incorporating a flapper valve in the bottom of the basket of the tool.
Figure 3:
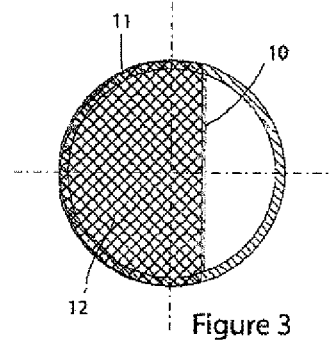
FIG. 3 is a section plan view of FIG. 2.
Figure 5:
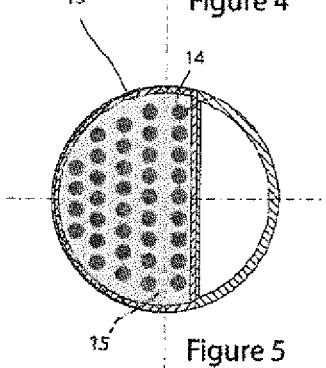
FIG. 5 is a section plan view of FIG. 4 with the flapper valve shown closed (the flapper valve having filter flow through passages in its construction.
Figure 6:
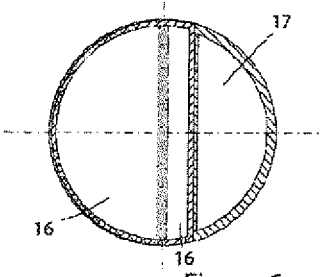
FIG. 6 is a section plan view of FIG. 4 with the flapper valve shown open.

Referring to FIGS. 1 to 6, there is shown production tubing, a check valve 2 and a knock off circulation port 3 Inside the joint of tubing, is mounted modules 4 which consist an upper ring 5 a lower ring 6 an internal bore 7 in lower ring in which the reduced diameter 8 of the upper rig fits, this enables these modules to be stacked together. A basket compartment with an open top 9 into which solids can fall into the basket, and sides of straight cord 10 and circumference 11 and the base 12. The mesh size of the basket is selected to trap the solids in the produced fluid, and could 50 mesh to 100 mesh or any other preferred mesh size. The lower surface of the basket could also incorporate a flapper type valve 13 with ports 14 and a mesh 15 in the port, in normal operation the flapper will be flat to the bottom of the basket, but, in the event of a surge of solid slurry, it would be advantageous for the flapper to open and provide virtually full bore flow area 16 for the slurry to flow through. The normal flow path 17 is always open. To protect the basket from erosion, a deflector 18 could be fitted which would direct flow to the flow passage 17, and protect the lower surface of the basket 19, it would have slots in it so allowing the passage of fluid during solids fallback. Ideally, the modules are stacked on top of each other, and when solids fall back, initially the upper basket 20 fits, any solids that by pass it fill the next basket down 21, and this is repeated to basket 22, 23, 24, 25 etc.

Figure 7:
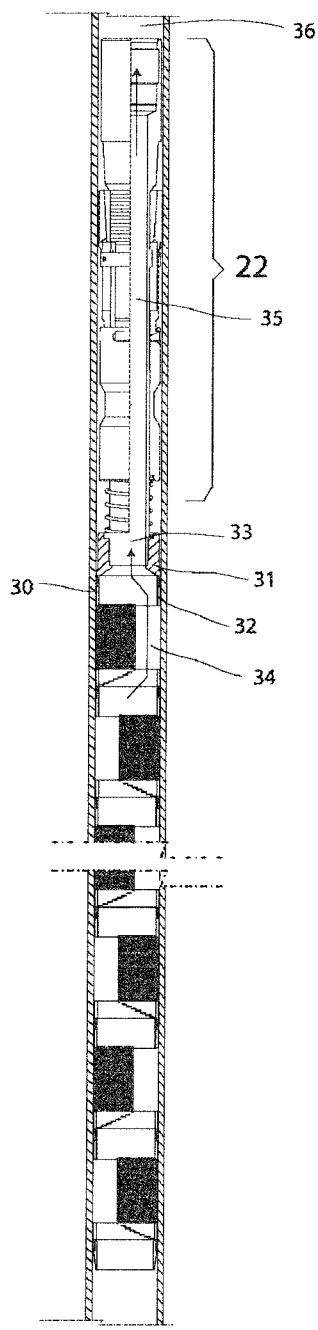
FIG. 7 is a section side view of tubing in a well with another embodiment of the complete apparatus installed inside it deployed on slickline and suspended in the tubing using a commercially available hanger (22).

Referring to FIG. 7, the system could also be deployed riglessly, the modules described above could be connected together and conveyed into a well using slickline and suspended in the well using a commercially available tool 22. This is available from a company called D&D International, it is called a AD-2 tubing stop and can be used in any tubing string. The AD-2 tubing stop can be set any place in the tubing string with a nominal tubing ID. It can also be used as a slick line-retrievable anchor. The AD-2 tubing stop is held in the set position by slips that engage the tubing wall. When installing the AD-2 tubing stop, the appropriate GS pulling tool and the attached stop are lowered into the tubing string using standard slick line methods. The AD-2 tubing stop can be set by simple manipulation of the wireline which shears the pin and the spring forces the slips onto the cone locking the tubing stop in place. The tubing stop body, which contains the slip cone, is driven tightly behind the slips by heavy downward jarring. When removing the AD-2 tubing stop, upward jarring with the appropriate GS pulling tool causes the slips to release and allows the tubing stop to be pulled to the surface.

It is attached to the upper most module 30 top of assembly via an adaptor 31 which has a threaded box connection 23 on its lower end and a threaded connection 32 on its upper end which attaches it to the AD-2 assembly 22. Passages 33 in the adaptor allow the flow from the module passages 34 into the internal bore 35 of the AD-2 tool and into the production tubing 36 above the AD-2.

Figure 8:
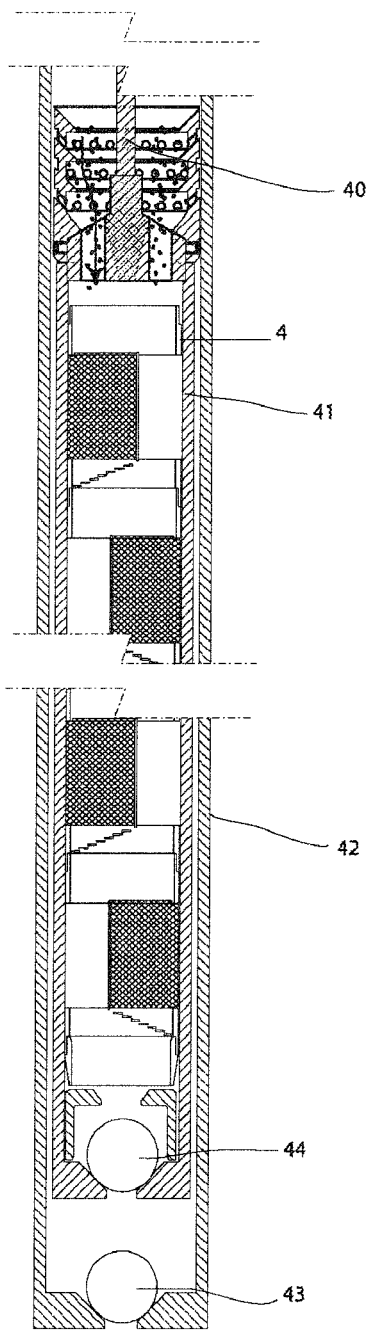
FIG. 8 is a section side view through a rod lift pump, with the apparatus installed inside the plunger body.
Figure 16:
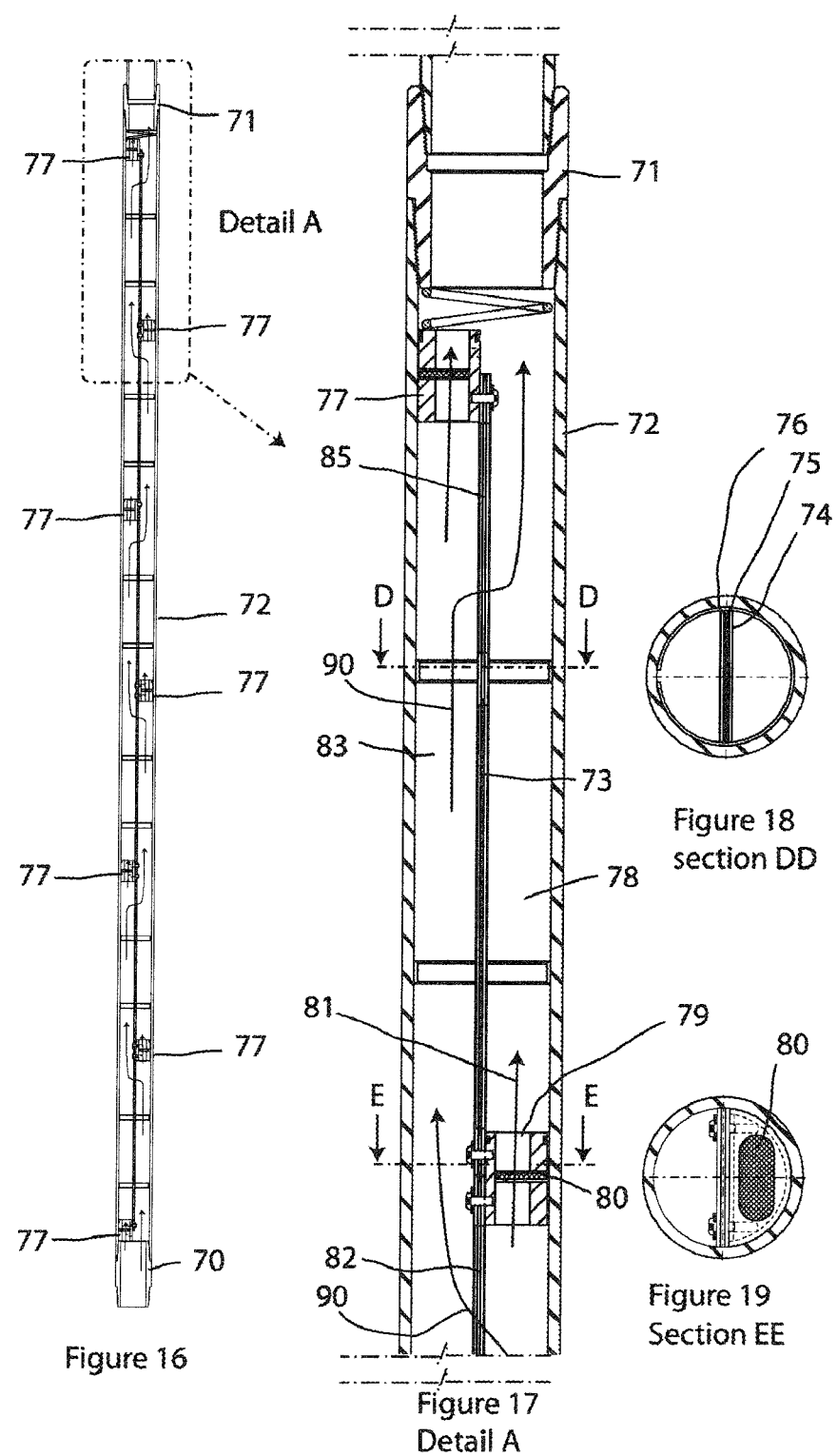
FIG. 16 is a section side view through another embodiment of the invention.
Figures 20, 21:
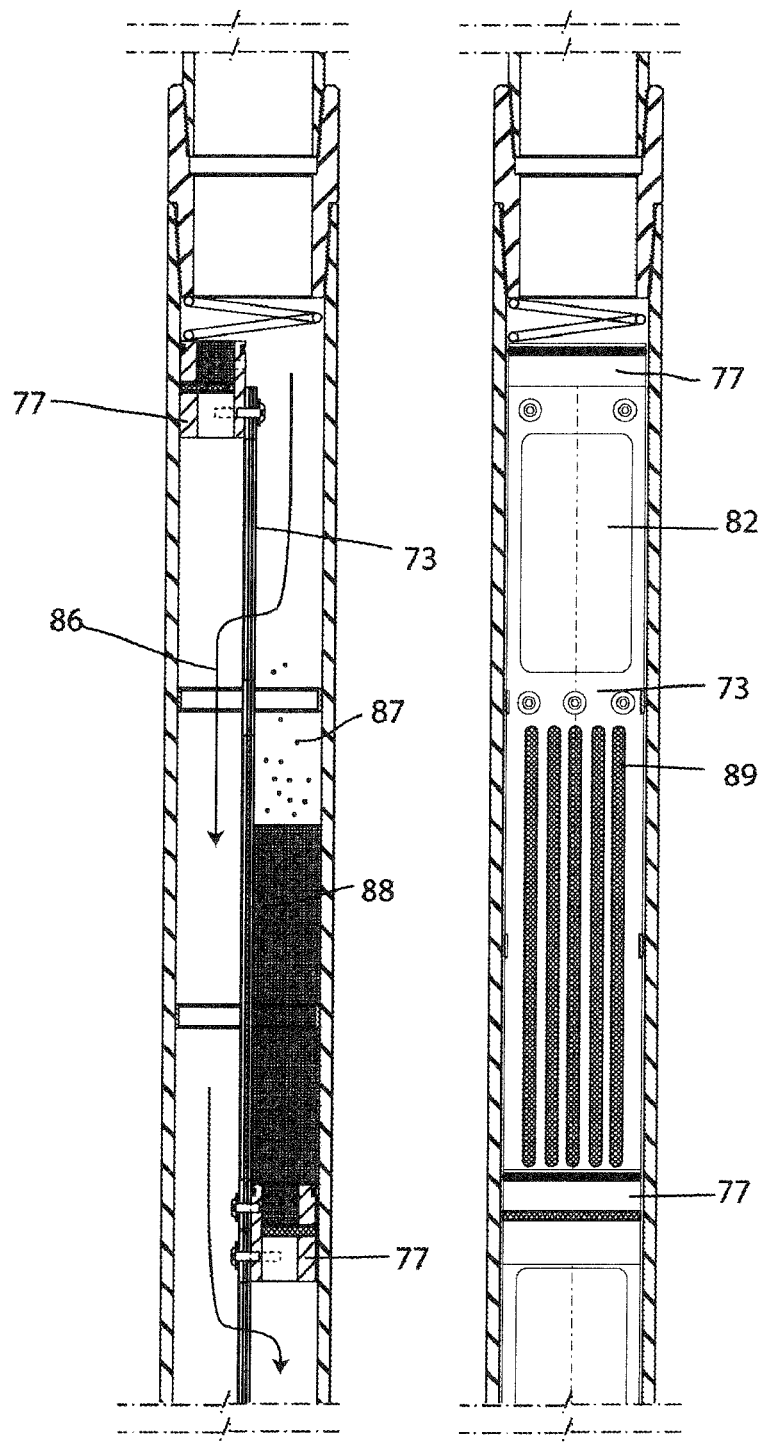
FIG. 20 is a similar view to FIG. 17 with sand fallback being collected in the side basket.
FIG. 21 is a side view of FIG. 17.
Figure 22:
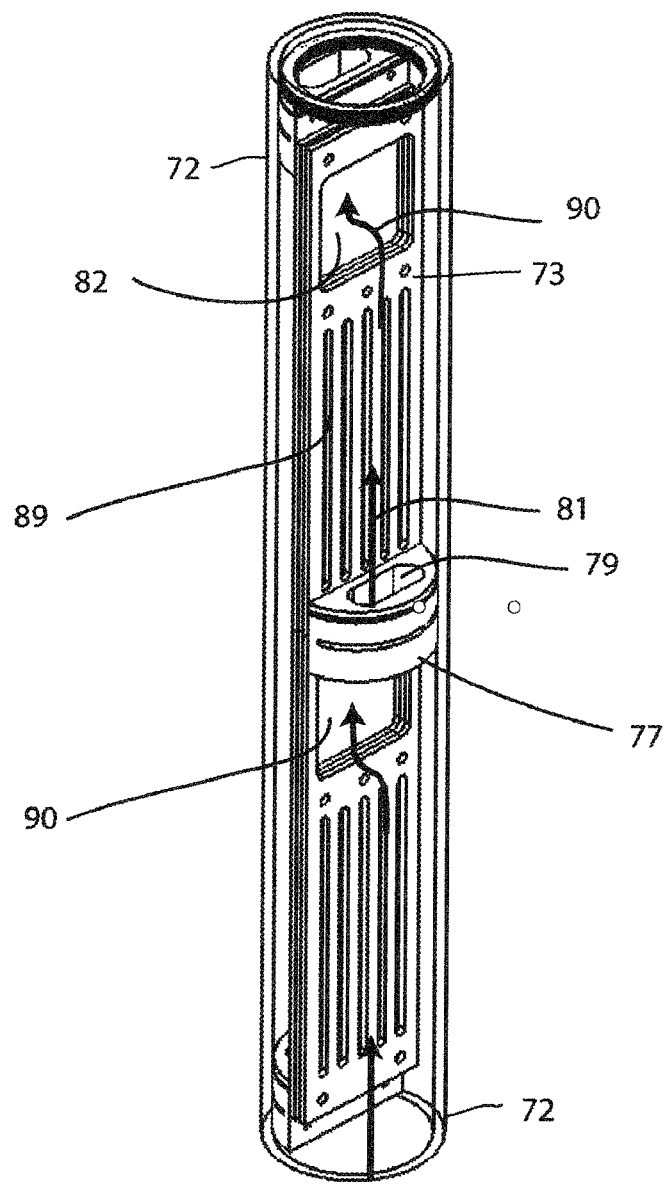
FIG. 22 is an isometric view of the two shelfs shown in FIG. 17.
Figure 23:
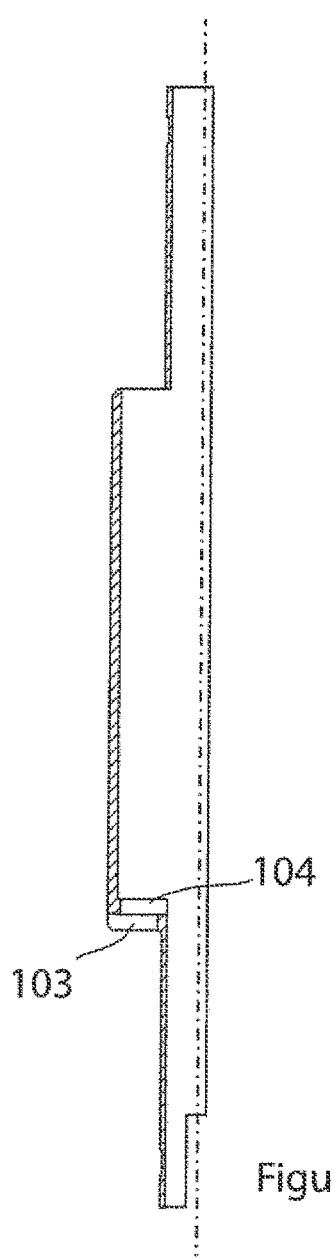
FIG. 23 is a section side view through another embodiment of the invention.
Figure 24:
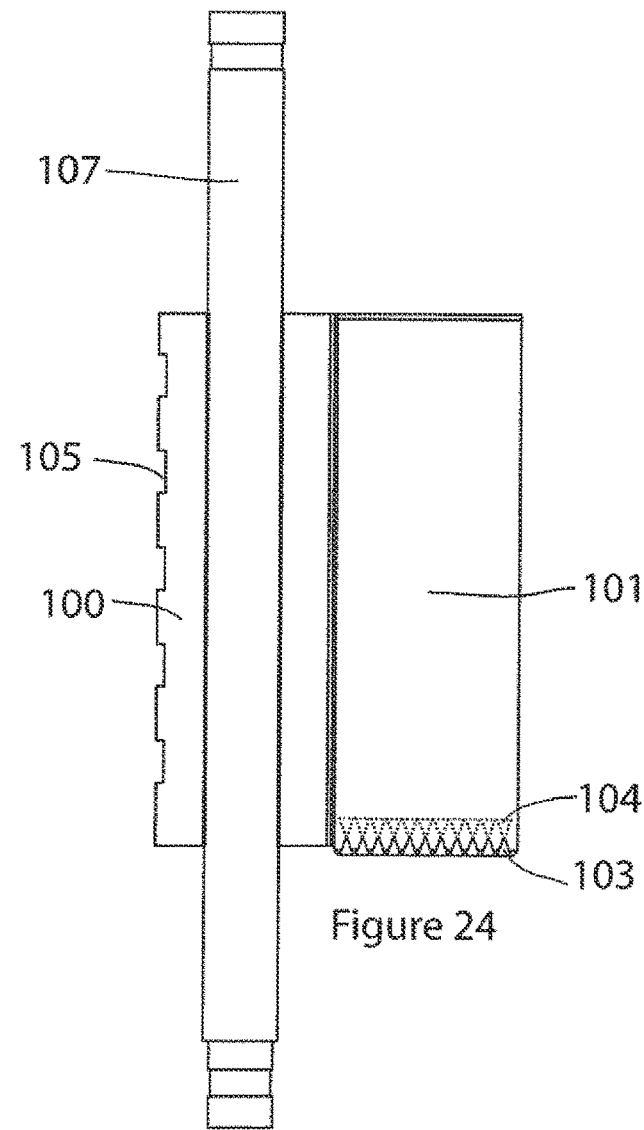
FIG. 24 is an orthogonal side view of FIG. 22.
Figure 25:
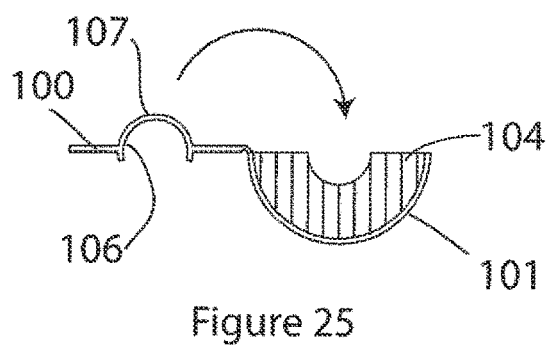
FIG. 25 is an end view of FIG. 24.
Figure 26:
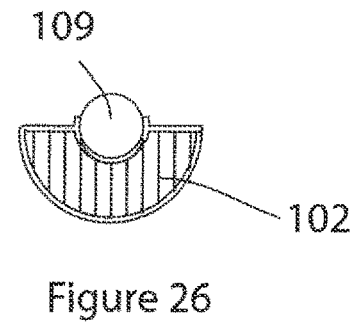
FIG. 26 is a similar view to FIG. 25 in a folded position.
Figure 30:
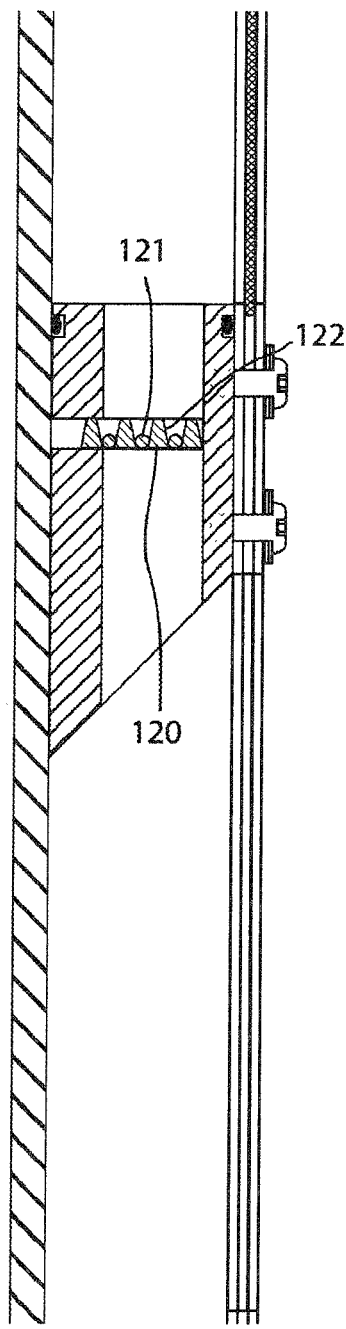
FIG. 30 is a section side view through a shelf with another embodiment of the filter.
Figure 31:
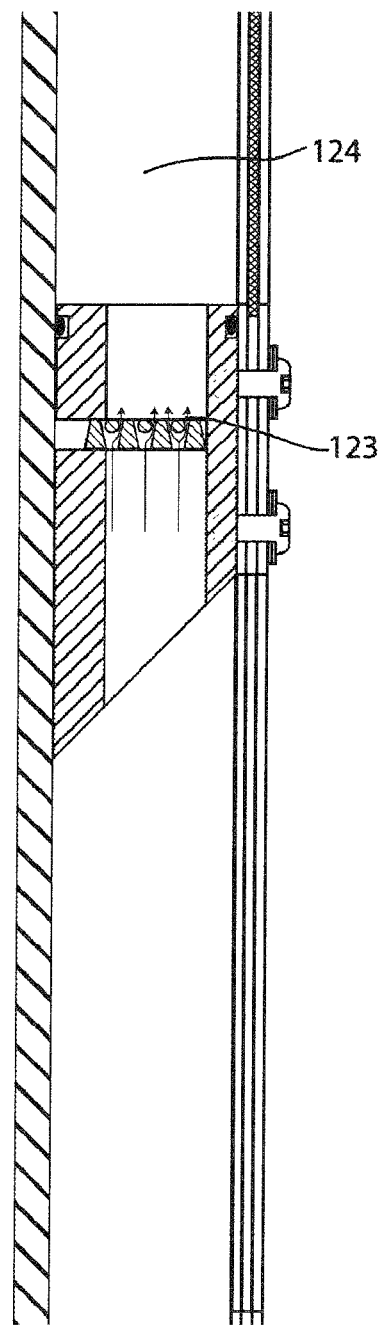
FIG. 31 is a similar view to FIG. 30 with flow in the reverse direction.
Figure 34:
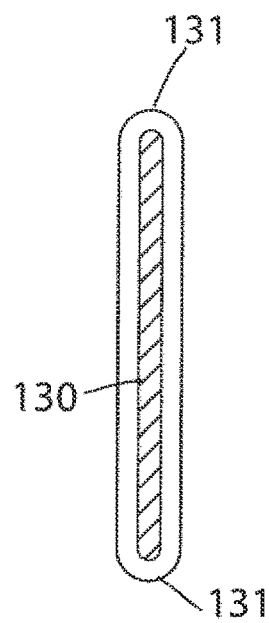
FIG. 34 is a side view of the continuous V wire screen shown in FIG. 32.
Figure 32:
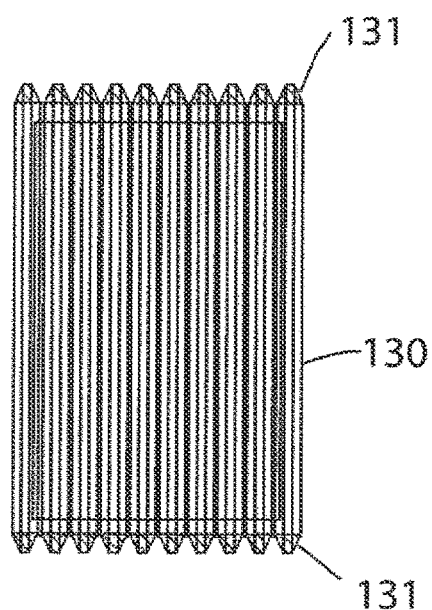
FIG. 32 is a plan view of a continuous V wire screen.
Figure 33:
FIG. 33 is a section side view of the continuous V wire screen shown in FIG. 32.
Figure 35:
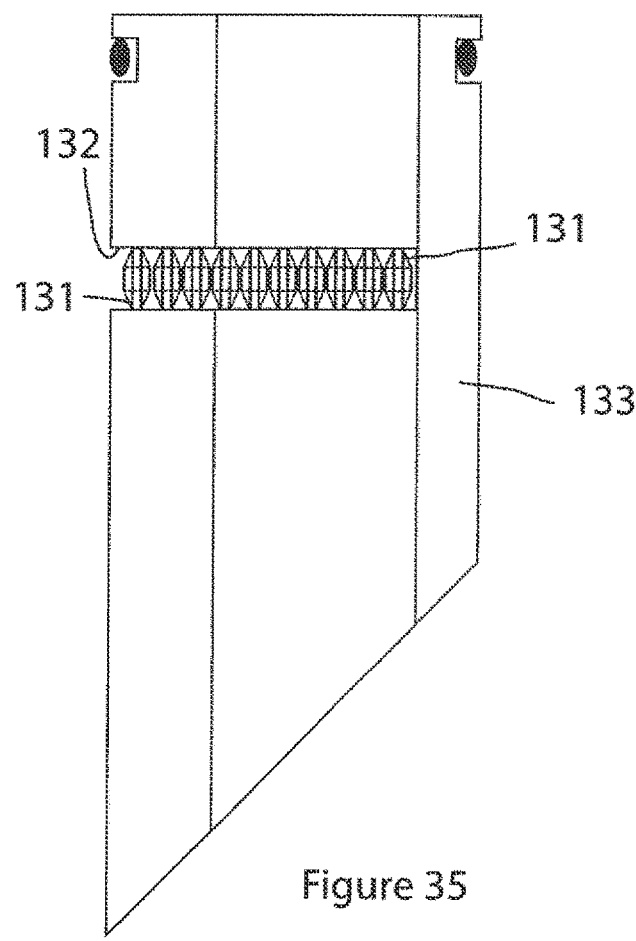
FIG. 35 is a section side view of the shelf with the screen shown in FIG. 32 inserted into the horizontal slot.

Referring to FIG. 8 there is shown a section side view of a rod lift type pump. The rod 40 from surface attaches to the top of the plunger 41, at the top of the plunger is a series of funnels described in an earlier patent application. The plunger sits inside a static pump barrel, at the lower end of the pump barrel is a static non return valve 43. At the bottom of the plunger piston is a travelling non return valve 44. The modules 4 described earlier could reside inside the plunger piston and could collect the fall-back solids and prevent them from falling onto the travelling non-return valve 44.

Referring to FIGS. 9 and 10, there is shown a section through the production tubing 50 somewhere between the pump and surface. Inside the production tubing is a rod lift string 51, and this is reciprocated up and down to operate the downhole pump. If ceramic or other material centralisers 52 are placed at the top and bottom of a rod, then for that section of production tubing the rod will be perfectly centralised. Attached to the rod would be simple baskets 53 which would only occupy one side of the tubing/rod annulus 54 while the other side 55 would be clear for production fluid to freely flow. The baskets would be placed on alternate sides 56,57 so as to capture all the solids fall back in the event of a pump shutdown.

Referring to FIGS. 11 to 14 there is shown another embodiment of the invention. It consists of two side frame members 60,61. The side frames act as a structural member to which everything else is attached. To make a basket, a straight mesh screen 62 encloses the central line, the inner surface of the tubing 63, is the outer surface of the basket, and a flat half circle plate 64 which has a close fit to the tubing 63 and attaches to the frames 60,61 provides the bottom of the basket. The plate 64 could have a fixed mesh screen, or it could have a flapper valve type screen 65 hinged by pins 66, for the reason previous described.

Referring to FIG. 15, this is a table with different tubing sizes, rod sizes and baskets dimensions providing an indication of the solids storage capability of the device, and for an arbitrary number of baskets what the overall storage capacity is vs what a typical volume of solids are in a production fluid. These figures are only for helpful comparison as real well figures can vary significantly.

Referring to FIGS. 16 to 22 there is shown another embodiment of the invention. It consists of a lower connection 70 which connects to the discharge side of the pump, an upper connection 71 and a tubular housing 72. Inside the tubular member 72 is a vertical member 73, consisting of three layers, two outer layers 74,75 and an inner sandwich layer 76. Attached to the vertical sandwich layer are crescent shaped shelfs 77, these create a closed chamber 78, at the bottom of this chamber is the shelf 77 and in this shelf is a passage 79 and midway in this passage is a filter 80 of a selected mesh size, this allows the flow of fluid in the upward direction 81 through the chamber 78. Fluid flow up can also flow through the large passage 82 of the vertical sandwich assembly along the crescent flow path with no shelf 83 to another opening in the vertical sandwich 85. In the event of a shut down, fluid above the pump will fall down 86 through this device, through the pump and equalise with the fluid in the tubing annulus. Any solids 87 in the flow will collect in the closed chamber 88 and be stored there, preventing them from going into the pump discharge. Along the vertical side of the chamber are passages and filter material 89, also to help solids flow into the catchment chambers a helical flow generator 91 makes to returning solids flow in a spiral path. When pumping is recommenced, fluid will flow up following the easiest path 90, it will also flush clean the solids stored in the closed chamber 88, by flowing into the filter path 89 and 80. It will be appreciated that the solids produced with the production fluid can be different mesh sizes, so it may be advantageous to have different mesh sizes for the different shelfs, foe example, for a 12 shelf device, the upper two shelfs could be 40 mesh, the next two 60 mesh, the next two 80 mesh, the next two 100 mesh, the next two 120 mesh and last two 140 mesh Referring to FIGS. 23 to 29 there is shown another embodiment to the sucker rod pump solids capture device. It consists of an injection moulded part. It has two halves, 100 and 101, which when folded together form a crescent shaped basket 102 which occupies about half the production tubing flow area. At the lower end of the basket thin slots have been created in the bottom of the basket, by the action of the moulding tool. A V shape tool or die from the outside creates V shaped grooves 103 on the outer most lower side of the bottom of the basket, and a V shaped inner die or tool creates V shaped grooves on the inner side of the top face of the bottom of the basket 104. The tips of 103,104 of the dies touch each over and after the moulding process, the width of the tips equal the size of mesh. i.e 40 mesh is equal to 0.0165", 70 mesh is equal to 0.0083" and 100 mesh is equal to 0.0059". Using such opposing dies with V-shaped section grooves produces a mesh parallel screen bars; a mesh having cross bars may be produced by opposing dies having corresponding truncated pyramid features, the mesh size being determined by the size of the truncated apex of the pyramid portions of the dies.

An interlocking feature 105 locks the two halves together once folded together. The inner diameter 106 is sized to clip around the sucker rod 107, and once clipped onto the rod, cannot come away freely as it circumference extends beyond the centre line of the rod. At each end of the basket are two long spacers 107,108, which provide a spacing to connect more than one of these assemblies to another. When two or more assemblies are paired together, they are 180 degrees relative to each other, as shown by 110,111. At there overlap they have a recess that forms a 360 channel 112 into which a clamp 113 can be installed to lock the two parts to the sucker rod. At the top an bottom of the rod a centraliser 114 is fitted to provide a stand off and protect the baskets from rubbing against the internal surface of the production tubing.

Referring to FIGS. 30 to 34 there are shown some further embodiments to the shelf filter screen. In one embodiment, the screen will consist of triangle shaped bars 120, with round bars 121 situated between them, when flow is coming up from the pump, the round bars 121 lift off from the angular face 122 and provide a large flow area 123 to better flush the basket storage area 124. In flow shut down the rods 121 would fall down and come to rest on the angular surface 122, this could be then zero flow back or have slots or grooves etc (not shown) to allow non or controlled return flow. Alternatively, a frame 130 could allow a continuous triangular wire 131 to be wrapped around it to form a filter screen on both the top side and lower side of the frame. This could be inserted into the slot 132, of the crescent shaped shelf 133.

The invention claimed is:

1. A downhole apparatus to collect solids fallback in the tubing of an oil producing borehole comprising two or more baskets to collect the solids fall back, each basket partially occupies a portion of an inner cross section of the tubing, leaving a portion of the inner cross section of the tubing having an unrestricted flow path, the baskets when considered in plan view along longitudinal axis of the tubing are distributed such that together they cover substantially the whole inner cross section of the tubing while leaving an unobstructed non-straight flowpath around the baskets, wherein a base of each baskets includes a valve.

2. An apparatus according to claim 1 wherein the baskets are fabricated from a filter material.

3. An apparatus according to claim 1 wherein the baskets are arranged to collect fall back solids from different sectors of the tube, the baskets may overlap each other in terms of coverage.

4. An apparatus according to claim 1 wherein the valve is formed at the bottom of each of the baskets, the valve comprising one of a filter or a flapper valve of filter material construction, such that in the event of a flow of solids the flapper valve opens to provide full flow until the flow has passed.

5. An apparatus according to claim 1 wherein the downhole apparatus may form a part of a hydrocarbon production system, and may be used during production of hydrocarbons.

6. An apparatus according to claim 1 wherein the baskets include a sintered mesh filter.

7. An apparatus according to claim 1 wherein the baskets include a wire screen filter.

8. An apparatus according to claim 1 wherein a spacing between the baskets is created by an injection moulding process.

9. An apparatus according to claim 1 wherein the baskets include ceramic V shaped bars.

10. An apparatus according to claim 1, wherein the valve comprises a combination of V shaped bars and round rods, wherein the round rods lift off from the V shaped bars to provide a flow area up and then sit down the V shaped bars in reverse flow and have no flow back.

11. An apparatus according to claim 1 wherein each basket includes a filter of different mesh size.

12. An apparatus according to claim 1 wherein the apparatus is incorporated in an artificial lift production system comprising one or more downhole electric submersible pumps located below the apparatus.

13. An apparatus according to claim 1 wherein the apparatus is installed with a pump inlet to collect solids before they enter the pump.

14. An apparatus according to claim 1 wherein the baskets include V shaped parallel grooves.

15. An apparatus according to claim 1 wherein the baskets include vertical member having a large passage above passages with filter material.

16. An apparatus according to claim 15 wherein the baskets include crescent shaped shelves, which together with the tubing create closed chambers.

* * * * *